US011190189B1

(12) United States Patent
Huss

(10) Patent No.: US 11,190,189 B1
(45) Date of Patent: Nov. 30, 2021

(54) DUAL PATH LEVEL SHIFTER TO REDUCE DUTY CYCLE DISTORTION

(71) Applicant: Cadence Design Systems, Inc., San Jose, CA (US)

(72) Inventor: Scott David Huss, Cary, NC (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/005,099

(22) Filed: Aug. 27, 2020

(51) Int. Cl.
*H03K 19/0175* (2006.01)
*H03K 5/156* (2006.01)
*H03K 3/037* (2006.01)
*G06F 1/04* (2006.01)

(52) U.S. Cl.
CPC ....... *H03K 19/017509* (2013.01); *G06F 1/04* (2013.01); *H03K 3/037* (2013.01); *H03K 5/1565* (2013.01)

(58) Field of Classification Search
CPC .. G06F 1/04; G06F 1/06; H03K 3/017; H03K 3/037; H03K 5/156; H03K 5/1565; H03K 7/08; H03K 19/0175; H03K 19/017509; H03K 19/01806; H03K 19/018507; H03K 19/018521
See application file for complete search history.

(56) References Cited

U.S. PATENT DOCUMENTS

| 8,010,819 B2* | 8/2011 | Pastorello | G06F 1/3203 713/323 |
| 9,263,949 B2* | 2/2016 | Tsukuda | H03K 19/018521 |
| 2006/0261851 A1* | 11/2006 | Kim | H03K 3/011 326/81 |

* cited by examiner

*Primary Examiner* — Long Nguyen
(74) *Attorney, Agent, or Firm* — Schwegman Lundberg & Woessner, P.A.

(57) ABSTRACT

A level shifter circuit comprises a first and second path connected in parallel. The first path comprises three inverters connected in series, and the first path generates a first intermediate clock signal based on an input clock signal. The first intermediate clock signal has a first duty cycle distortion. The second path also comprises three inverters connected in series and the second path generates a second intermediate clock signal based on the input clock signal. The second intermediate clock signal has a second duty cycle distortion. A level shifter output provides an output clock signal based on a combination of the first and second intermediate clock signals. The combination of the first and second intermediate clock signals results in an averaging of the first and second duty cycle distortions in the output clock signal.

20 Claims, 5 Drawing Sheets

DUAL PATH LEVEL SHIFTER TO REDUCE DUTY CYCLE DISTORTION

TECHNICAL FIELD

The present disclosure generally relates to integrated circuit (IC) design. In particular, the present disclosure addresses a dual path level shifter circuit design.

BACKGROUND

A level shifter is a circuit used to translate signals from one logic level or voltage domain to another. Level shifters are typically used to bridge domains between processors, logic, sensors and other circuits. It is common for level shifter designs to use multiple voltage supplies. For example, a conventional level shifter design can include a set of inverters or invertors connected in series, where one or more inverters or buffers are connected to a core voltage while at least one other inverter or invertor is connected to a regulator voltage. However, when an input signal crosses supplies, duty cycle distortion is introduced in the stepped-up or stepped-down output signal. Duty cycle distortion (DCD) refers to an amount by which a mean positive width of cycles in a waveform of a signal differ from the mean negative width.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure include a dual path level shifter to reduce duty cycle distortion along with systems, method, devices, and other circuits related thereto. A first path of the level shifter comprises a first set of inverters connected in series and a second path of the level shifter comprises a second set of inverters connected in series. In general terms, N inverters in the first path are connected to a first voltage supply (e.g., a voltage regulator) and M+1 inverters in the first path are connected to a second voltage supply (e.g., a core voltage supply). In this second path, N+1 inverters are connected to the first voltage supply and M inverters are connected to the second voltage supply. As an example, the first set of inverters can include a first inverter, a second inverter, and a third inverter connected in series, and the second set of inverters can include a fourth inverter, a fifth inverter, and a sixth inverter connected in series. In this example, the first, fourth, and fifth inverters are connected to a first voltage supply, and the second, third, and sixth inverters are connected to a second voltage supply.

An input clock signal is received at a level shifter input. The first path generates a first intermediate clock signal based on the input clock signal, and the second path generates a second intermediate clock signal based on the input clock signal. The first intermediate clock signal has a first duty cycle distortion and the second intermediate clock signal has a second duty cycle distortion. For example, the first intermediate clock signal may have a positive duty cycle distortion and the second intermediate clock signal may have a negative duty cycle distortion.

The first and second paths are connected in parallel to a level shifter output that provides an output clock signal based on a combination of the first and second intermediate clock signals. The combination of the first and second intermediate clock signals results in an averaging of the first and second duty cycle distortion in the output clock signal. In some instances, the averaging of the first and second duty cycle distortion results in duty cycle distortion being eliminated in the output clock signal.

Figure 1A:
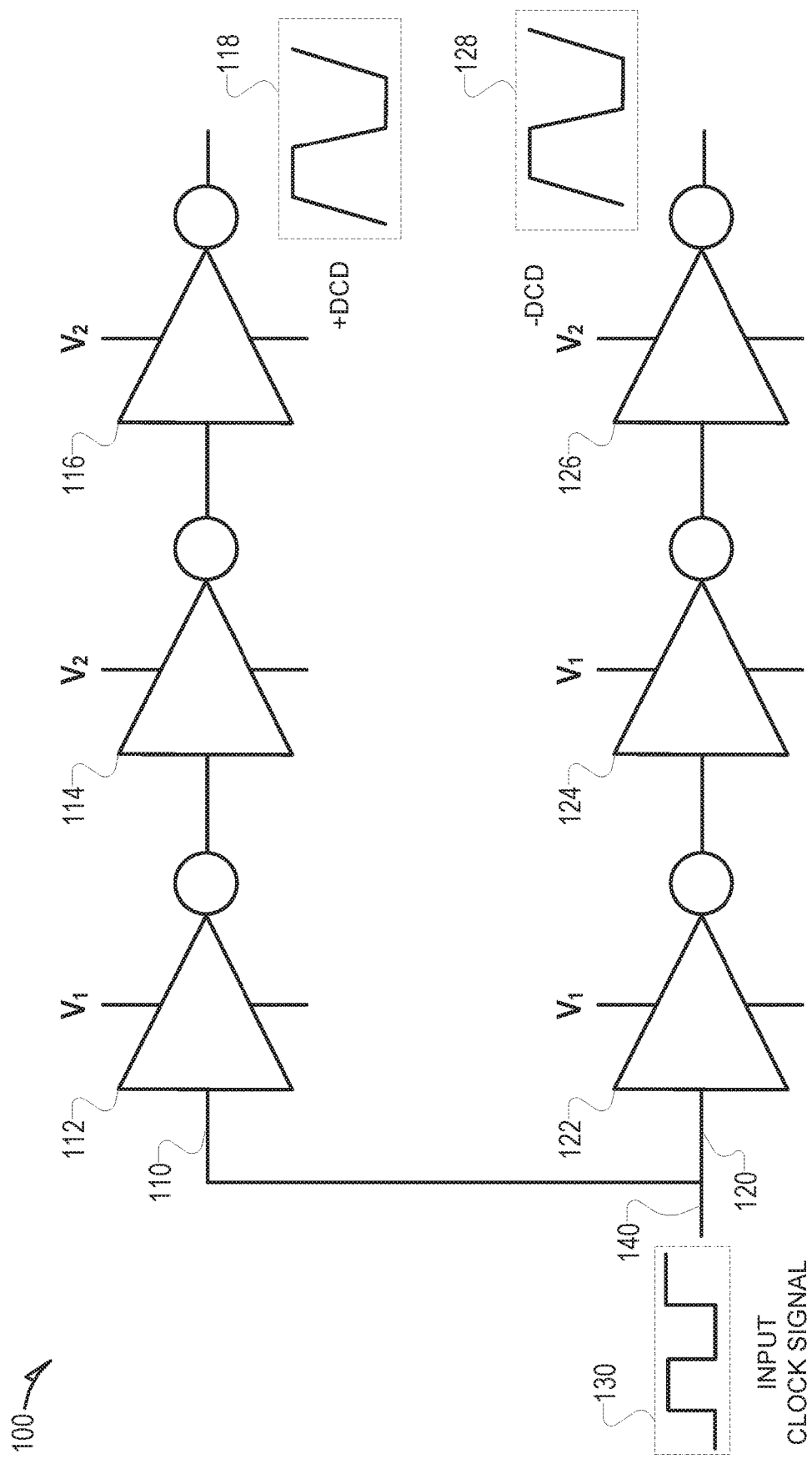
FIGS. 1A-1D are circuit diagrams illustrating a dual path level shifter circuit for reducing duty cycle distortion in an output signal, according to some example embodiments.

With reference to FIG. 1A, a dual path level shifter 100 is shown, consistent with some embodiments. The dual path level shifter 100 includes two paths connected in parallel: first path 110 and second path 120. First path 110 comprises a chain of inverters—inverters 112, 114, and 116—connected in series. Inverter 112 is connected to a first voltage supply and inverters 114 and 116 are connected to a second voltage supply. Second path 120 comprises inverters 122, 124, and 126 connected in series. Inverters 122 and 124 are connected to the first voltage supply and inverter 126 is connected to the second voltage supply. In an example, the first voltage supply corresponds to a voltage regulator (VREG) and the second voltage supply corresponds to a core voltage (VCORE).

The dual path level shifter 100 receives an input clock signal 130 at input 140 from a clock source. The input clock signal 130 is at an input signal level.

As shown in FIG. 1A, the first path 110 generates a first intermediate clock signal 118 based on the input clock signal 130, and the second path 120 generates a second intermediate clock signal 128 based on the input clock signal 130. In generating the first and second intermediate clock signals 118, 128, the first and second paths 110, 120 translate the input signal level of the input clock signal 130 to an output signal level. The first and second paths 110, 120 can either translate the input signal level up or down, though the present subject matter may particularly useful in instances in which the output signal is a stepped-down signal. The first intermediate clock signal 118 has a positive duty cycle distortion (denoted by "+DCD" in FIG. 1A) and the second intermediate clock signal 128 has a negative duty cycle distortion (denoted by "−DCD" in FIG. 1A).

Figure 1B:
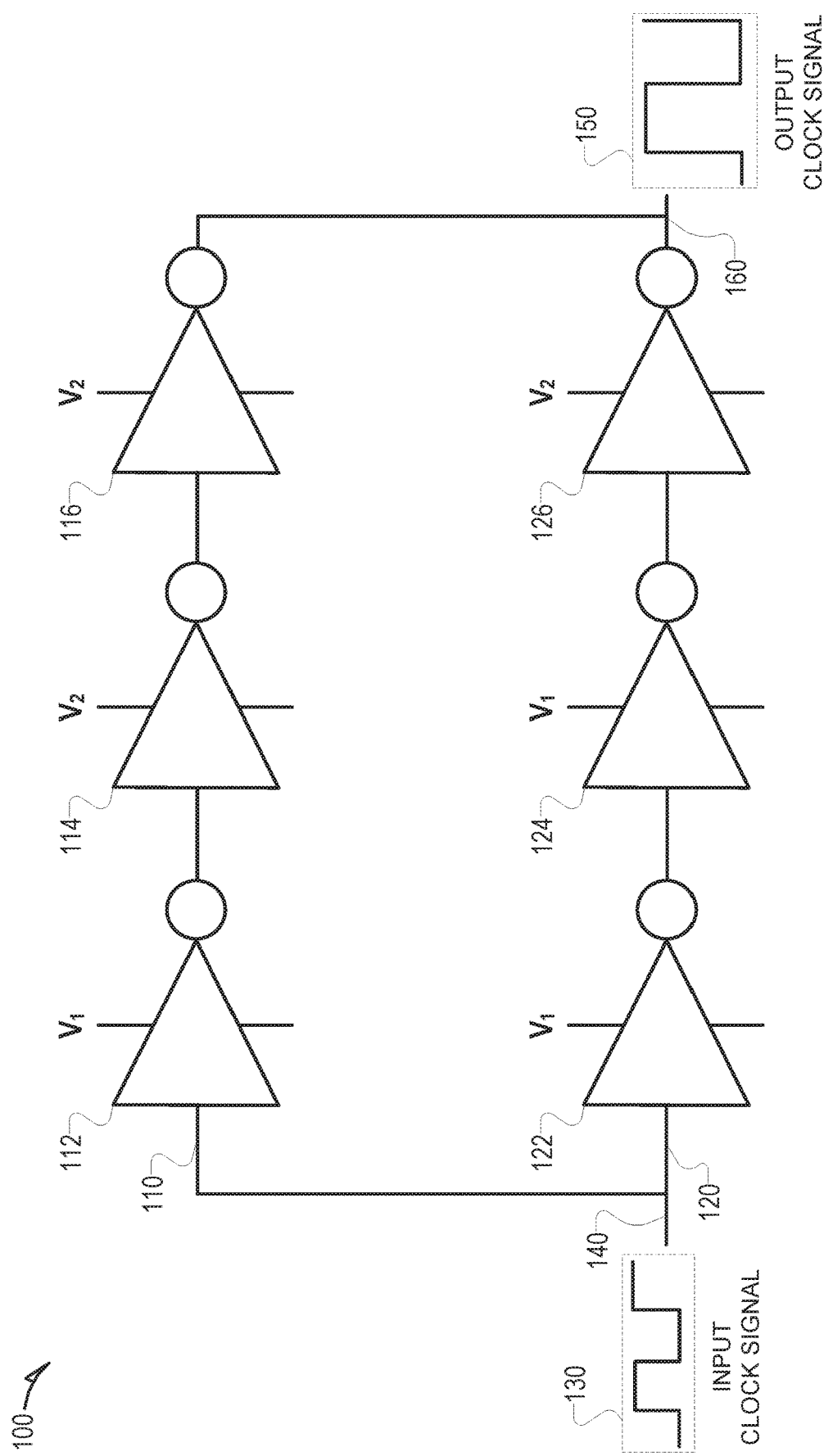

With reference to FIG. 1B, the outputs of the first path 110 and the second path 120 are connected to combine the first and second intermediate clock signals 118, 128. An output clock signal 150 based on the first and second intermediate clock signals 118, 128 is generated and provided at output 160. The output clock signal 150 has a duty cycle distortion that is the average of the duty cycle distortions of the first and second intermediate clock signals 118, 128. Assuming that the rise and fall times of the intermediate clock signals match, the duty cycle distortion in the output clock signal 150 is approximately eliminated.

Figure 1C:
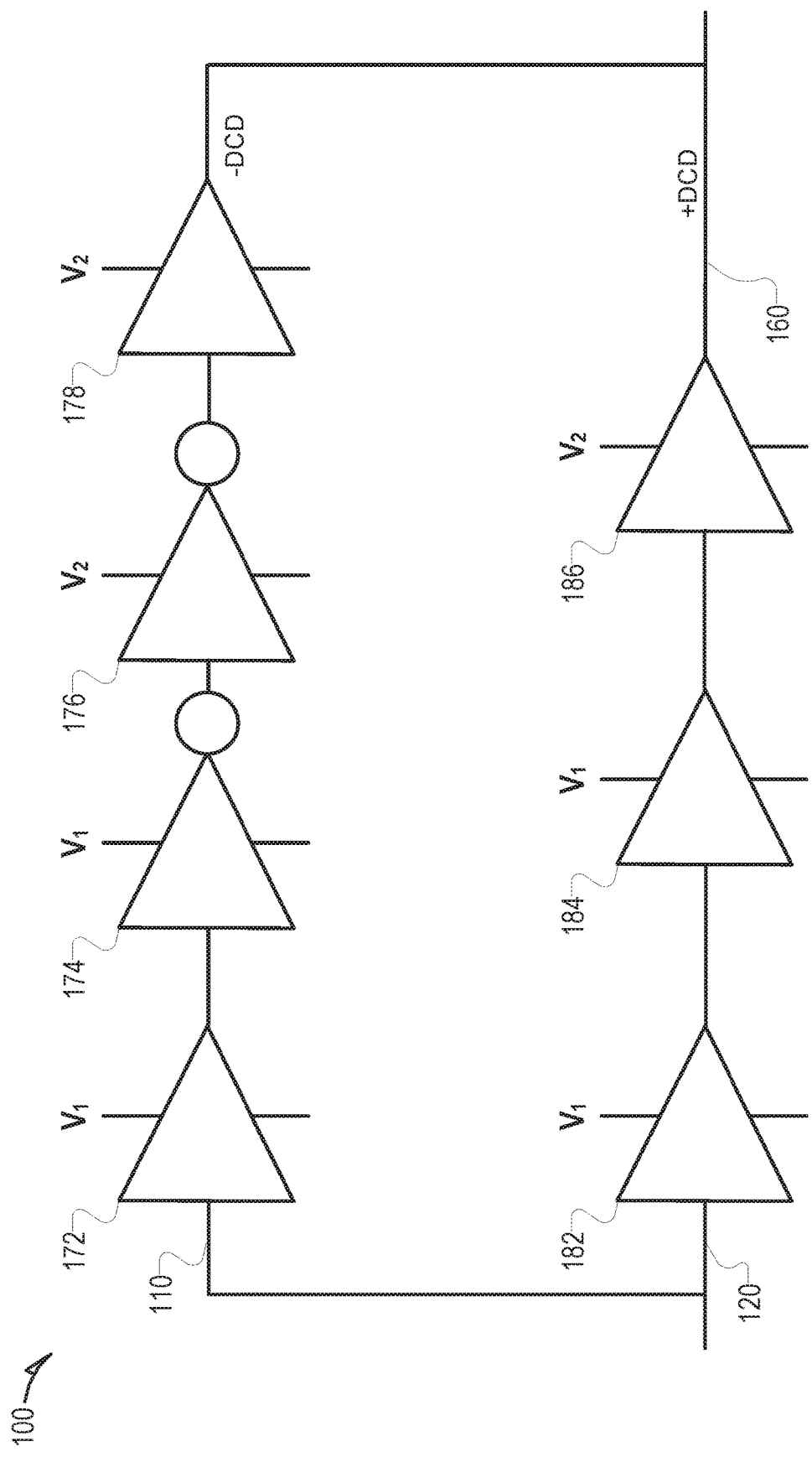

It shall be appreciated that although FIGS. 1A-1B illustrate the dual path level shifter 100 comprising parallel chains of inverters, in alternative embodiments, clock buffers may be included in the paths 110 and 120. For example, as shown in FIG. 1C, the path 110 can comprise buffer 172, inverter 174, inverter 176, and buffer 178 connected in series and the path 120 can comprise inverters 182, 184, and 186 connected in series. As shown, the buffers 172, 182, and 184 and inverter 174 are connected to the first voltage supply while inverter 176, and buffers 186 and 178 are connected to the second voltage supply. In this example, the first intermediate signal generated by the path 110 has a negative duty cycle distortion while the second intermediate signal generated by the path 120 has a positive duty cycle distortion.

Figure 1D:
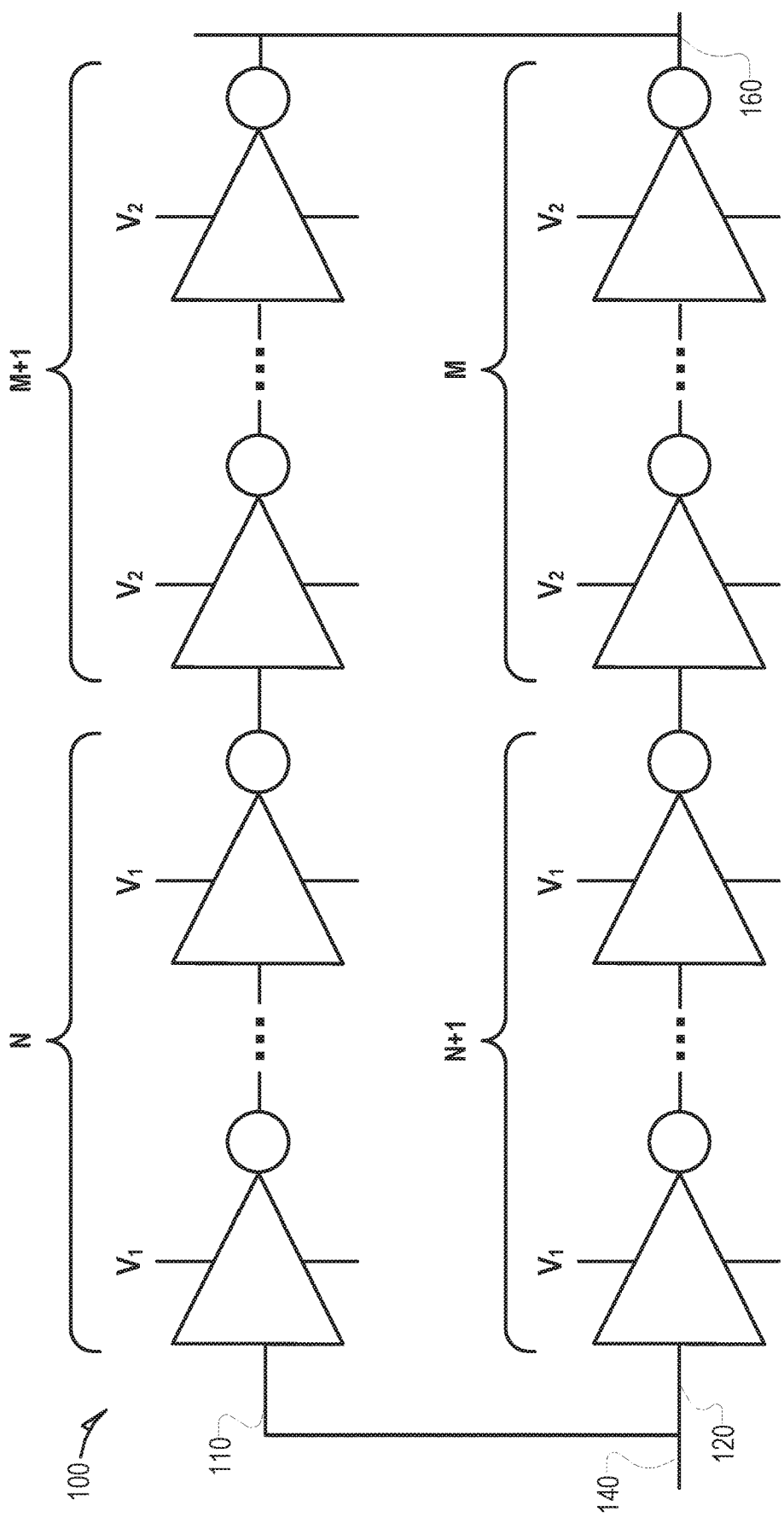
Figure 2:
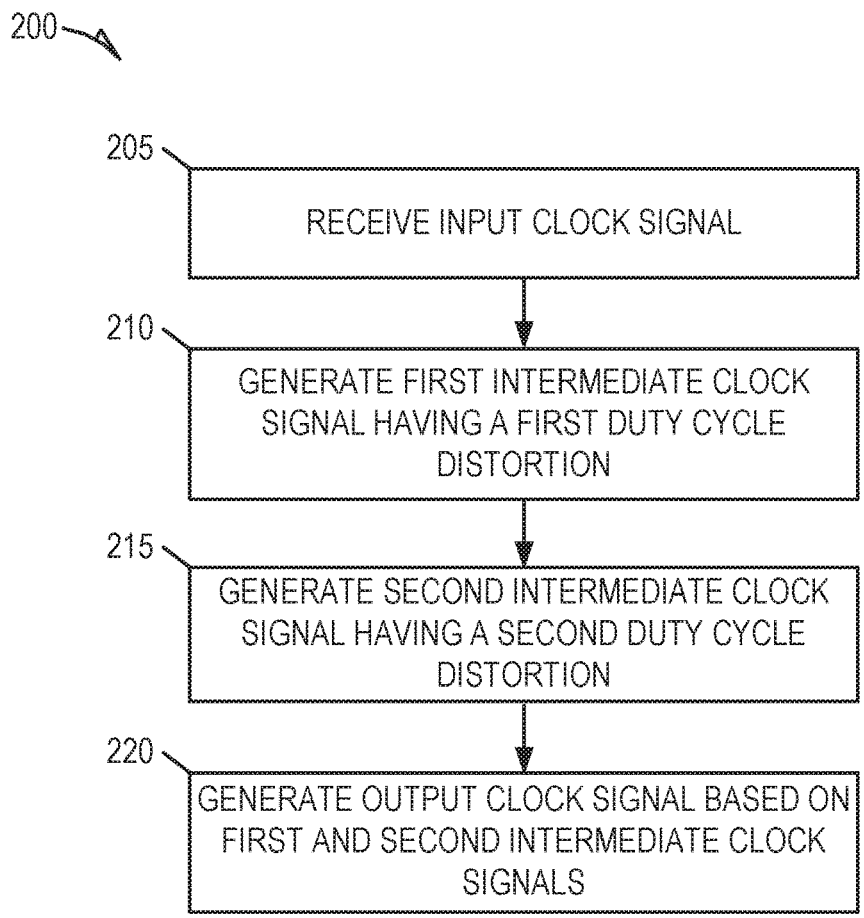
FIG. 2 is a flow chart illustrating example operations of the dual path level shifter circuit in generating an output signal, according to some example embodiments.

It shall be further appreciated that although FIGS. 1A-1B illustrate both of the dual paths 110 and 120 comprising three inverters, the dual paths are not limited to three inverters, and in other embodiments, the dual paths 110 and 120 may include fewer or additional inverters. For example, as illustrated in FIG. 1D, the path 110 may include a first set of inverters where N inverters in the first set are connected to the first voltage supply and M+1 inverters in the first set are connected to the second voltage supply. The path 120 includes a second set of inverters where N+1 inverters in the second set are connected to the first voltage supply and M are connected to the second voltage supply. In the example described above in reference to FIGS. 1A-1B, M and N are 1, though other values of N and M are used in other embodiments, as mentioned above. FIG. 2 is a flow chart illustrating example operations of the dual path level shifter 100 in performing a method 200 of generating an output signal, according to some example embodiments. Depending on the embodiment, an operation of the method 200 may be repeated in different ways or involve intervening operations not shown. Though the operations of the method 200 may be depicted and described in a certain order, the order in which the operations are performed may vary among embodiments, including performing certain operations in parallel.

At operation 205, the dual path level shifter 100 receives an input clock signal at input 140. The input clock signal is at a first signal level (an input signal level).

The first path 110 generates a first intermediate clock signal (e.g., first intermediate clock signal 118) based on the input clock signal, at operation 210, and the second path 120 generates a second intermediate clock signal (e.g., second intermediate clock signal 128), at operation 215. In generating the first and second intermediate clock signals, the first and second paths 110, 120 translate the first signal level of the input clock signal to a second signal level. Hence, the resulting output clock signal is at the second signal level. The second signal level may be higher or lower than the first signal level, though the method 200 may find particularly useful in instances in which the second signal level is lower than the first signal level. That is, the method 200 can provide the greatest reduction to duty cycle distortion in instances in which the output signal is a stepped-down signal relative to the input signal.

The first intermediate clock signal has a first duty cycle distortion and the second intermediate clock signal has a second duty cycle distortion. More specifically, the first intermediate clock signal has a positive duty cycle distortion and the second intermediate clock signal has a negative duty cycle distortion.

At operation 220, the dual path level shifter 100 generates an output clock signal (e.g., output clock signal 150) by combining the first and second intermediate clock signals. The output clock signal is provided at the output 160. The combining of the first and second intermediate clock signals results in an averaging of the first and second duty cycle distortions. Assuming that the rise and fall times of the first and second intermediate clock signals match, the averaging of the first and second duty cycle distortions effectively eliminates the duty cycle distortion in the output clock signal given that the first duty cycle distortion is positive and the second duty cycle distortion is negative. In this way, the duty cycle distortion is corrected in the output clock signal.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A level shifter circuit comprising:
a first path comprising a first inverter, a second inverter, and a third inverter connected in series, the first path to generate a first intermediate clock signal based on an input clock signal, the first intermediate clock signal having a first duty cycle distortion, the first inverter being connected to a voltage regulator, the second and third inverters being connected to a processing core supply voltage, the voltage regulator providing a higher supply voltage than the processing core supply voltage;

a second path connected in parallel with the first path, the second path comprising a fourth inverter, a fifth inverter, and a sixth inverter connected in series, the second path to generate a second intermediate clock signal based on the input clock signal, the second intermediate clock signal having a second duty cycle distortion, the fourth and fifth inverters being connected to the voltage regulator, the sixth inverter being connected to the processing core supply voltage; and a level shifter output connected to the first and second paths, the level shifter output to provide an output clock signal based on a combination of the first and second intermediate clock signals, the combination of the first and second intermediate clock signals resulting in an averaging of the first and second duty cycle distortions in the output clock signal.

2. The level shifter circuit of claim 1, wherein:
the first duty cycle distortion is a positive duty cycle distortion; and
the second duty cycle distortion is a negative duty cycle distortion.

3. The level shifter circuit of claim 2, wherein averaging the first and second duty cycle distortions eliminates duty cycle distortion in the output clock signal.

4. The level shifter circuit of claim 1, wherein:
an output of the first inverter is connected to an input of the second inverter;
an output of the second inverter is connected to an input of the third inverter;
an output of the fourth inverter is connected to an input of the fifth inverter; and
an output of the fifth inverter is connected to an input of the sixth inverter.

5. The level shifter circuit of claim 1, wherein:
the first path comprises a seventh inverter connected in series with the first inverter, second inverter, and third inverter; and
the second path comprises an eighth inverter connected in series with the fourth inverter, fifth inverter, and sixth inverter.

6. The level shifter circuit of claim 1, wherein:
the input clock signal is at a first signal level; and
the output clock signal is at a second signal level.

7. The level shifter circuit of claim 6, wherein:
the first and second intermediate clock signals are at the second signal level.

8. The level shifter circuit of claim 6, wherein the second signal level is lower than the first signal level.

9. A method comprising:
receiving, at a level shifter circuit, an input clock signal;
generating, by a first path of the level shifter circuit, a first intermediate clock signal based on an input clock signal, the first intermediate clock signal having a first duty cycle distortion, the first path of the level shifter circuit comprises a first inverter, a second inverter, and a third inverter connected in series, the first inverter being connected to a voltage regulator, the second inverter and the third inverter being connected to a processing core supply voltage, the voltage regulator providing a higher supply voltage than the processing core supply voltage;
generating, by a second path of the level shifter circuit, a second intermediate clock signal based on the input clock signal, the second intermediate clock signal having a second duty cycle distortion, the second path of the level shifter circuit comprises a fourth inverter, a fifth inverter, and a sixth inverter connected in series, the fourth and fifth inverters being connected to the voltage regulator, the sixth inverter being connected to the processing core supply voltage; and combining the first and second intermediate clock signals to generate an output clock signal, the combining of the first and second intermediate clock signals resulting in an averaging of the first and second duty cycle distortions in the output clock signal.

10. The method of claim 9, wherein:
the first duty cycle distortion is a positive duty cycle distortion; and
the second duty cycle distortion is a negative duty cycle distortion.

11. The method of claim 10, wherein averaging the first and second duty cycle distortions eliminates duty cycle distortion in the output clock signal.

12. The method of claim 9, wherein:
the first path comprises a seventh inverter connected in series with the first inverter, second inverter, and third inverter; and
the second path comprises an eighth inverter connected in series with the fourth inverter, fifth inverter, and sixth inverter.

13. The method of claim 12, wherein:
the seventh inverter is connected to the processing core supply voltage; and
the eighth inverter is connected to the voltage regulator.

14. The method of claim 9, wherein:
the input clock signal is at a first signal level; and
the output clock signal is at a second signal level.

15. The method of claim 14, wherein:
the first and second intermediate clock signals are at the second signal level.

16. The method of claim 14, wherein the second signal level is lower than the first signal level.

17. A device comprising:
a first chain of buffers connected in series, the first chain of buffers to generate a first intermediate clock signal based on an input clock signal, a first set of buffers in the first chain being connected to a voltage regulator, a second set of buffers in the first chain being connected to a core supply voltage, the first intermediate clock signal having a duty cycle distortion, the voltage regulator providing a higher supply voltage than the core supply voltage;
a second chain of buffers connected in series, the first and second chains of buffers being connected in parallel, the second chain of buffers to generate a second intermediate clock signal based on the input clock signal; and
a level shifter output connected between the first and second chains of buffers, the level shifter output to provide an output clock signal based on a combination of the first and second intermediate clock signals, the combination of the first and second intermediate clock signals resulting in a correction of the duty cycle distortion in the output clock signal.

18. The device of claim 17, wherein:
the first duty cycle distortion is a positive duty cycle distortion; and
the second duty cycle distortion is a negative duty cycle distortion.

19. The device of claim 17, wherein correction of the duty cycle distortion is an elimination of the duty cycle distortion in the output clock signal.

20. The device of claim 17, wherein the output clock signal is at a lower signal level than the input clock signal.

\* \* \* \* \*